United States Patent [19]

Fujimoto

[11] Patent Number: 5,872,395
[45] Date of Patent: *Feb. 16, 1999

[54] BENT TIP METHOD FOR PREVENTING VERTICAL MOTION OF HEAT SPREADERS DURING INJECTION MOLDING OF IC PACKAGES

[75] Inventor: George Fujimoto, Santa Clara, Calif.

[73] Assignee: International Packaging and Assembly Corporation, San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 714,244

[22] Filed: Sep. 16, 1996

[51] Int. Cl.⁶ .......................... H01L 23/495; H01L 23/28
[52] U.S. Cl. .......................... 257/675; 257/796; 257/712; 257/667; 257/707; 257/711
[58] Field of Search .................................. 257/712, 675, 257/706, 707, 711, 717, 720, 732, 796, 967

[56] References Cited

U.S. PATENT DOCUMENTS

| | | | |
|---|---|---|---|
| 3,646,409 | 2/1972 | van de Water et al. | 257/675 |
| 3,930,114 | 12/1975 | Hodge | 257/675 |
| 4,541,005 | 9/1985 | Hunter et al. | 257/675 |
| 5,428,246 | 6/1995 | Westerkamp | 257/675 |
| 5,436,492 | 7/1995 | Yamanaka | 257/704 |
| 5,489,801 | 2/1996 | Blish, II | 257/675 |
| 5,489,805 | 2/1996 | Hackitt et al. | 257/675 |
| 5,530,295 | 6/1996 | Mehr | 257/675 |
| 5,598,034 | 1/1997 | Wakefield | 257/706 |
| 5,641,987 | 6/1997 | Lee | 257/675 |
| 5,656,864 | 8/1997 | Mitsue et al. | 257/704 |

*Primary Examiner*—Tom Thomas
*Assistant Examiner*—Alexander Oscar Williams
*Attorney, Agent, or Firm*—Donald R. Boys

[57] ABSTRACT

A heat spreader to be molded into an encapsulated IC package in contact with a die attach pad carrying an IC die is adapted to be placed in a substantially rectangular mold cavity and to retain its position in the cavity while encapsulation material is injected. The heat spreader has a body portion with appendages extending toward each of the four walls, and the ends of the appendages furthest from the body are formed downward such as by bending to provide a support for the spreader from the bottom surface of the mold cavity substantially at the lines where the sidewalls meet the bottom surface of the mold cavity. In a preferred embodiment there are two appendages toward each sidewall, and the heat spreader before and during the molding process is supported from the bottom surface of the mold cavity by dimples through the body, forming additional supports.

8 Claims, 7 Drawing Sheets

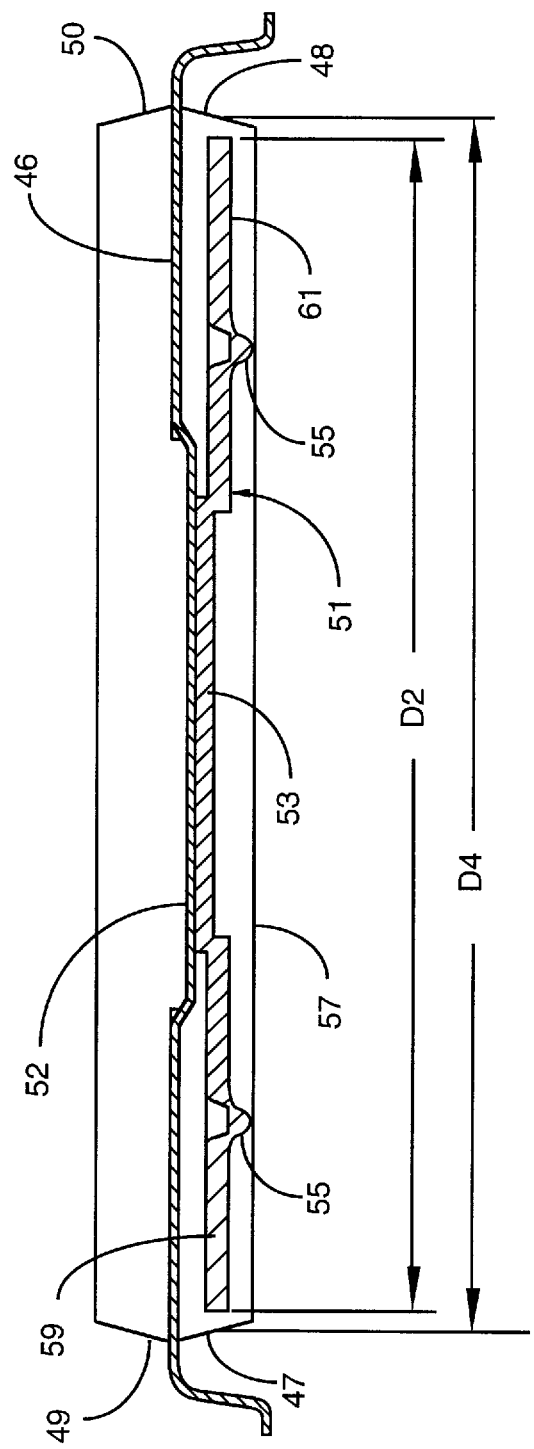

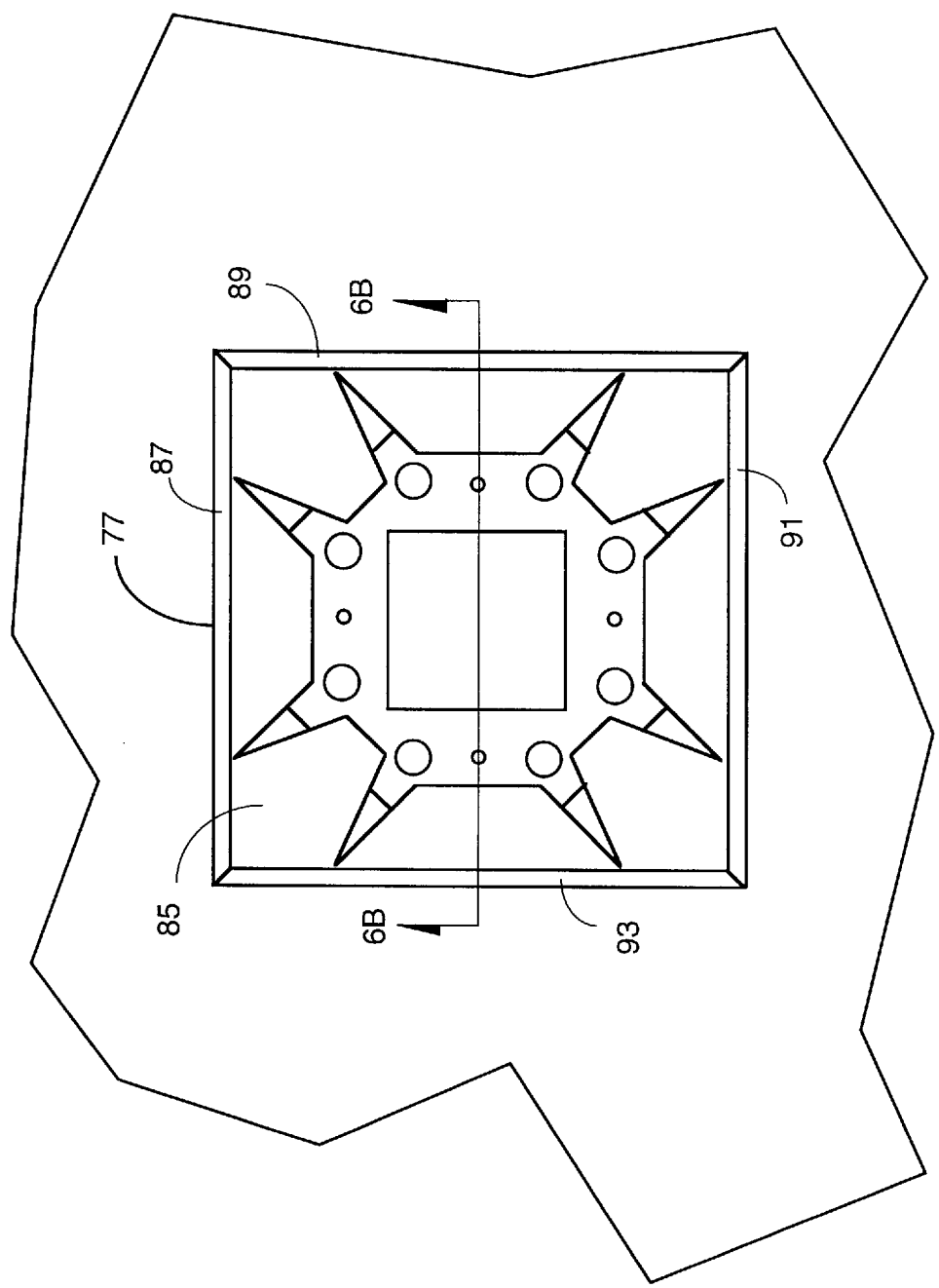

BENT TIP METHOD FOR PREVENTING VERTICAL MOTION OF HEAT SPREADERS DURING INJECTION MOLDING OF IC PACKAGES

FIELD OF THE INVENTION

The present invention is in the area of integrated circuit (IC) manufacturing, and pertains in particular to apparatus and methods for encapsulating integrated circuits on lead frames to form packaged IC's with leads for mounting to electronic circuitry, and to apparatus and methods for including heat sinks and heat spreaders in the encapsulated packages.

BACKGROUND OF THE INVENTION

In general, the plastic encapsulation of ICs to form packaged ICs with electrical leads is as follows: Typically, ICs in die form are attached to mounting areas called islands, or die attach pads, on strips termed lead frames in the art. In this specification the die attach pad terminology will be used. The lead frames are typically made of a thin, flat, metal sheet chosen for a number of characteristics including electrical conductivity. Lead frames typically have multiple individual die attach pads, each for supporting an individual IC during a molding operation wherein the individual dies are encapsulated in plastic material, leaving electrical leads protruding from the plastic encapsulation.

In many cases, densely packaged ICs are manufactured to maximize connectivity by utilizing all four sides of the chip. Around the perimeter of each die attach pad a typical lead frame has a pattern of individual conductive leads extending toward, but not contacting, the die attach pad. The die attach pads and individual leads are formed by selective removal of material in the lead frame, such as by stamping. The number of the leads at a frame with a single die attach pad depends directly on the configuration of the particular IC die to be mounted, that is, the number and location of electrical terminations to the die.

A typical IC may well over one hundred external terminations, and each frame will have a corresponding number of individual leads. The width of each lead and the separation between adjacent leads is dependent, among other things, on the package size of the finished IC. The thickness of each lead is the thickness of the lead frame and is predicated partly on the current carrying capacity required.

A plastic package with external leads for connecting to, for example, a printed circuit board, is typically formed by an encapsulation process. Mating molds are placed on each side of the lead frame and liquid-phase polymer is injected to encapsulate IC dies attached to the die attach pads in each frame. The lead frame is designed to dam the flow of liquid-phase polymer as it moves to the outer edges of each individual mold, stopping at the points where each mold contacts surfaces of the lead frame. To stop the flow of liquid-phase polymer between leads the lead frame has a pattern of dam bars between individual leads, so a contiguous band of material is formed around the periphery of the island. This contiguous band prevents the polymer from flooding the entire leadframe, and also allows the lead frame to be one contiguous piece of material until subsequent trimming operations are performed.

After the polymer material solidifies and the molds are removed, a following operation in the manufacturing process removes the excess plastic in the region around the mold outline and the dam bars. This is termed de-junking in the art. A de-damming process then removes the dam bar between each lead, providing electronic integrity for each lead. De-damming is a process of removing all or part of each dam bar by use of a punch with a pattern of teeth conforming to the pattern of the dam bars in the lead frame. Typically, the de-damnming and de-junking can be done in a single step.

In following processing each lead exposed from the edge of the plastic package is further treated such as by plating, and the individual packages are trimmed from the lead frame strip. Finally, the leads are formed, such as for Surface Mount Technology (SMT) applications.

In state-of-the-art manufacturing, automated machines are used to perform the encapsulation process. Automated machines are marketed by a number of manufacturers, including several Japanese manufacturers, and include molds made to close over one or more lead frames, as described above, whereinafter an encapsulation material is injected and caused to solidify. The encapsulation material is typically a liquid-phase polymer material.

There has long been, as is well known in the art, a decided trend toward higher and higher device density on IC chips, and a parallel tendency toward faster and faster operation. Many more devices (transistors) on each chip together with higher speed has quite naturally led to increased power usage, accompanied by a need for heat dissipation. High-end microprocessors, such as those used for computer CPUs operate at power levels in the range of from 25 to 100 watts. At such high power levels there is a critical need to dissipate heat from encapsulated chips at high rates.

As a consequence of the need for heat dissipation, manufacturers, and particularly those who do chip packaging, have developed heat spreaders and heat sinks to be encapsulated within IC packages, and in contact with either the ICs themselves or, more commonly, the die attach pads, to aid in spreading and sinking the heat from operating ICs. The idea in these methods is to increase the thermal mass of the structure, which limits the temperature rise given a particular power usage.

In earlier stages of encapsulation technology molds were typically designed to minimize the amount of material that must be injected. To minimize the encapsulation material, typical dimensions from the inside surface of a formation cavity of an upper half of a mold to the top of a die attached to a die attach pad, and from the inside surface of a formation cavity of a lower half of a mold to the underside of a die attach pad during injection of the liquid-phase polymer while the halves of the mold are closed, are relatively small. A typical dimension for these planned clearances was about 0.010 inches, which is about a quarter of a millimeter.

As device density has risen along with operating speed, providing ICs operating at high power, as described above, molds have been made somewhat larger to accommodate heat spreaders and heat sinks (which may be the same device in many cases). In use, such spreaders and sinks are typically placed in a lower mold portion such that placing a lead frame in position, the lead frame having ICs attached to the die attach pad (island) portions of the lead frame, brings the die attach pad in contact with the spreader/sink. Then an upper mold portion is closed on the lower mold portion such that the ICs on die attach pads are enclosed in individual molds, and semi-liquid polymer material is injected. The intent is that after injection and solidification of the polymer material, the heat sink/spreader will still be in contact with the die attach pad, so heat developed within the IC die in operation can be efficiently transferred to the heat sink/spreader.

Unfortunately, keeping a sink/spreader in position is no simple task. Throughput demands that injection must take place as quickly as practical, and, although effort is expended in mold design, there are always flow pattern that exert forces on the IC dies, the die attach pads, and on any heat sink/spreader that may be within a closed mold when injection takes place. These forces all too often move the components within the mold, and separate a spreader from its ideal position relative to a die attach pad and a mounted die either before solidification or as the polymer material solidifies. The result is often a defective IC package that will not operate at full spec below a maximum expected temperature for the operating IC die. In some cases dies fail due to high temperature, and in other cases performance is adversely affected.

Heat spreaders and heat sinks of many sorts have been developed and are in use at the time of the present patent application, but at the time of this application placement and positional integrity of heat sinks and spreaders is still a problem. What is needed is a heat sink/spreader that stays reliably in position, providing effective heat sinking after the processed packages are in service and operating at maximum power.

SUMMARY OF THE INVENTION

In a preferred embodiment of the present invention, a heart spreader for encapsulation in an IC package is provided, comprising a body portion and a raised land on the body portion The raised land has a substantially flat surface defining a first and upermost plane, which is adapted for contacting an undersurface of a die attach pad of a lead frame. Appendages from the body portion extend the body portion in a second and intermediate plane substantially parallel with the first plane. The appendages are formed downward at the ends furthest from the body portion such that the ends of appendages define a third and lowermost plane substantially parallel with the first plane.

In some embodiments there may be three or more supports extending away from the body portion on the opposite side of the body portion from the raised land, with the ends of the supports lying in the third and lowermost plane. In some embodiments there are four such supports and four appendages. In still other embodiments there may be eight appendages, two appendages side-by-side extending in each of the four directions, wherein four lines drawn across the tips of each pair of side-by-side appendages form a rectangle in third plane.

Spreaders according to embodiments of the invention may be made of any suitable material exhibiting a relatively high heat capacity and capability of heat conductance.

In another embodiment of the invention a method is provided for positioning a heat spreader in a lower cavity of a mold, wherein the lower cavity has a substantially rectangular bottom surface haveing a width and a length and four sidewalls intersecting the bottom surface. The method comprises steps of (a) providing appendages from a body of the heat spreader extending toward each of the side walls; (b) forming a portion of each of the appendages furthest from the body at a downward angle such that the end of the appendages define a plane, wherein the distance across the end of one pair of appendages extending in opposite directions is substantially equal to but not grater than the width of the bottom surface and the distance across the other pair of appendages is substantially equal to but not greater than the length of the bottom surface; and (c) placing the heat spreader on the bottom surface such that the heat spreader is supported from the bottom surface by the downwardly-formed end of the appendages.

Spreaders according to the present invention, wherein the ends of the appendages from the heat spreaders meet the intersection of the sidewalls of a mold cavity with the bottom surface of the mold cavity, are stable in position, and do not tend to ride up the angled sidewalls of mold cavities when encapsulation material is injected. Such spreaders also resist rotation in the mold cavity.

BRIEF DESCRIPTION OF THE DRAWINGS

FIG. 4 is an elevation cross section similar to FIG. 3, showing a mold closed on a lead frame with a heat spreader in place in a lower mold cavity.

FIG. 6A is a plan view of a heat spreader according to an embodiment of the present invention placed in a lower cavity of an encapsulation mold.

DESCRIPTION OF THE PREFERRED EMBODIMENTS

Figure 1:
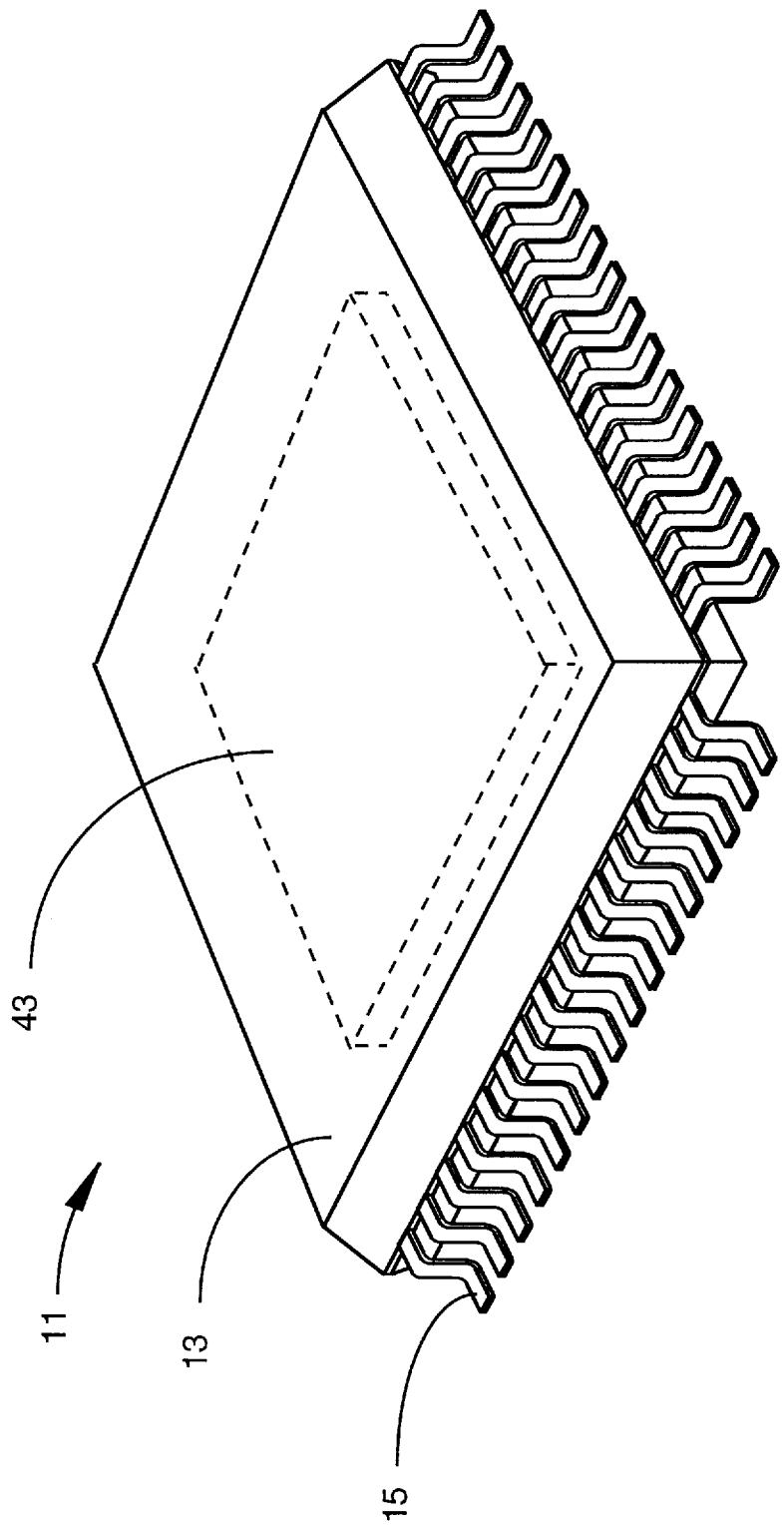
FIG. 1 is an isometric view of a Quad IC package in the prior art.

FIG. 1 is an isometric view of a conventional quad flat pack (QFP) IC package 11. Typically, body 13 of IC package 11 is formed of polymer material by a method of transfer molding. Die 43 is molded inside the package, completely encapsulated by the plastic molded body. The die contains the circuitry that defines the electrical functions of a particular IC, and the circuitry of the IC is connected to the outside environment through individual conductive leads 15, although the electrical connections from leads 15 to electrical contact pads on die 43 are not shown in FIG. 1. The leads, as show by this example, are often formed gull-wing-style into J-bends for surface mount technology (SMT) application in another process to printed circuit boards. The leads are typically formed from an electrically-conductive material that is receptive to bending and forming while maintaining structural integrity. The molded package protects the sensitive and fragile circuitry on the IC die and fixes the arrangement of individual leads.

It will be apparent to those with skill in the art that the QFP shown is a single example of several types of packages well-known in the art.

Figure 2:
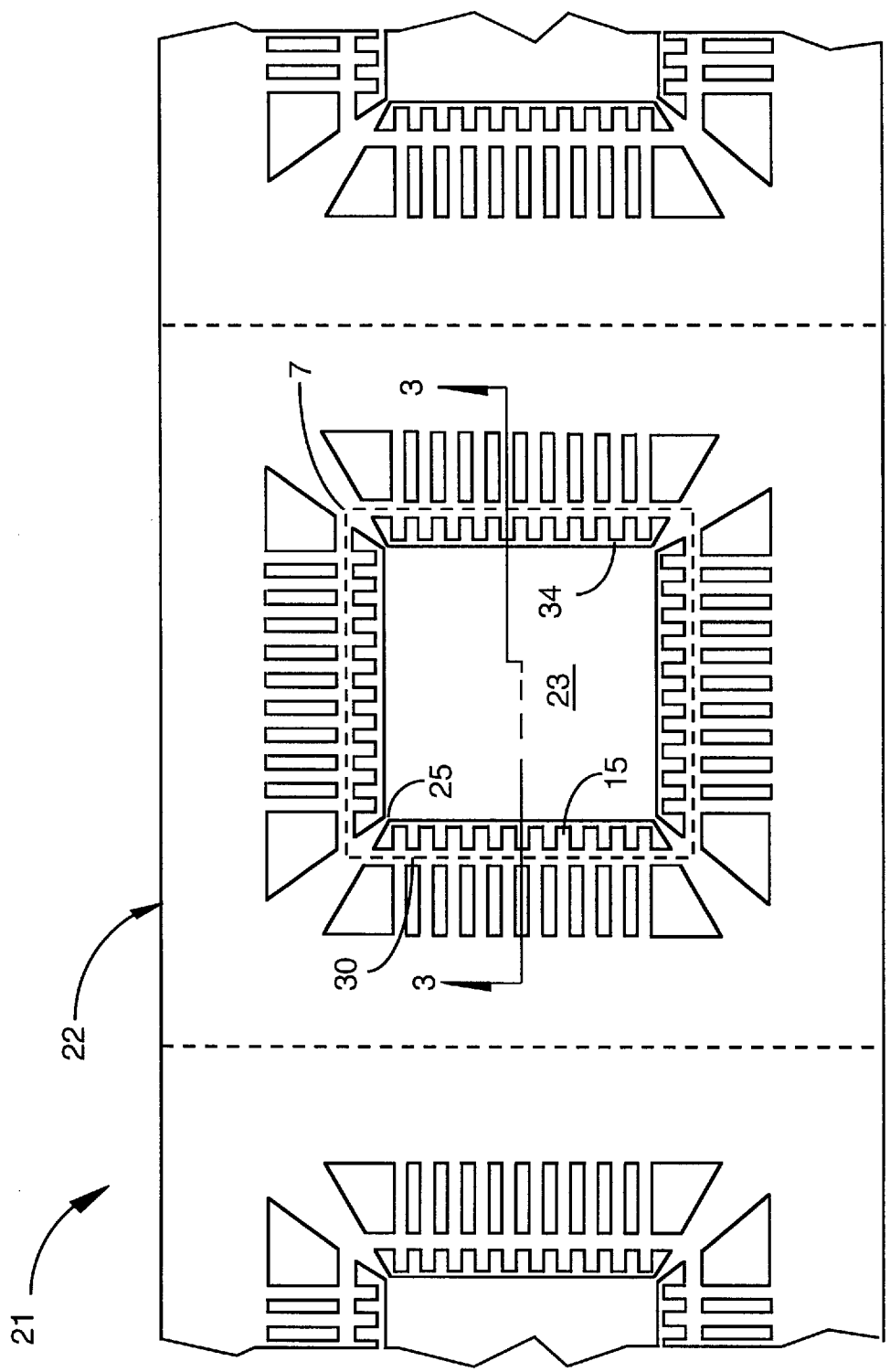
FIG. 2 is a somewhat idealized plan view of a portion of a lead frame in the prior art.

FIG. 2 is an idealized plan view of one full frame 22 of a typical lead frame strip 21 before the process of die attach and encapsulation. In this example the lead frame is for a QFP as presented in FIG. 1. Strip 21 comprises several frames identical to frame 22 whereon individual IC packages are constructed, and parts of two adjacent frames are shown. The layout of FIG. 2 is intentionally simplified to illustrate the principles involved.

As is well-known in the art, different lead frames for differently-designed dies typically have a different number of die attach pads in a strip. The lead frames are made of a conductive material, typically metal, and formed in thin sheets. The sheet thickness of lead frame strip 21 provides the thickness of the resulting leads from a finished IC package.

In the example of lead frame 22, a plurality of leads 15 are provided approaching, but not contacting, die attach pad 23. Gaps 34 serve to electrically isolate die attach pad 23 from each lead. Die attach pad 23 is supported in this example by legs 25 that are contiguous to lead frame strip 21, typically formed to attach at the corners of the die attach pad. Lead frame 22 also defines the outer edges of the plastic encapsulation by means of structures between leads 15 to stop the flow of the liquid-phase polymer in the encapsulation process. These structures comprise dam bars 30, and their placement between leads provides a contiguous strip of material around each island, illustrated by broken line 7.

The necessity for dam bars 30 means that at this stage all leads 15 surrounding island 23 are electrically connected to one another. The dam bars are subsequently removed (after encapsulation) by trimming punches in a separate process. The later removal of the dam bars provides electrical isolation from each lead to the others.

In a die attach process, individual IC dies are affixed to each die attach pad, in this example, substantially centered and aligned so the four edges of the die at each frame are parallel to the edges of the die attach pad of the lead frame. In a wire-bonding process, conductive wires are bonded from each contact termination along each of the four edges of the die to the corresponding leads along the four edges of the die attach pad. These wires form the electrical connection in a finished IC package from the circuitry in the integrated circuit to the electrical leads that are subsequently bonded to circuitry and other devices on a printed circuit board.

Figure 3:
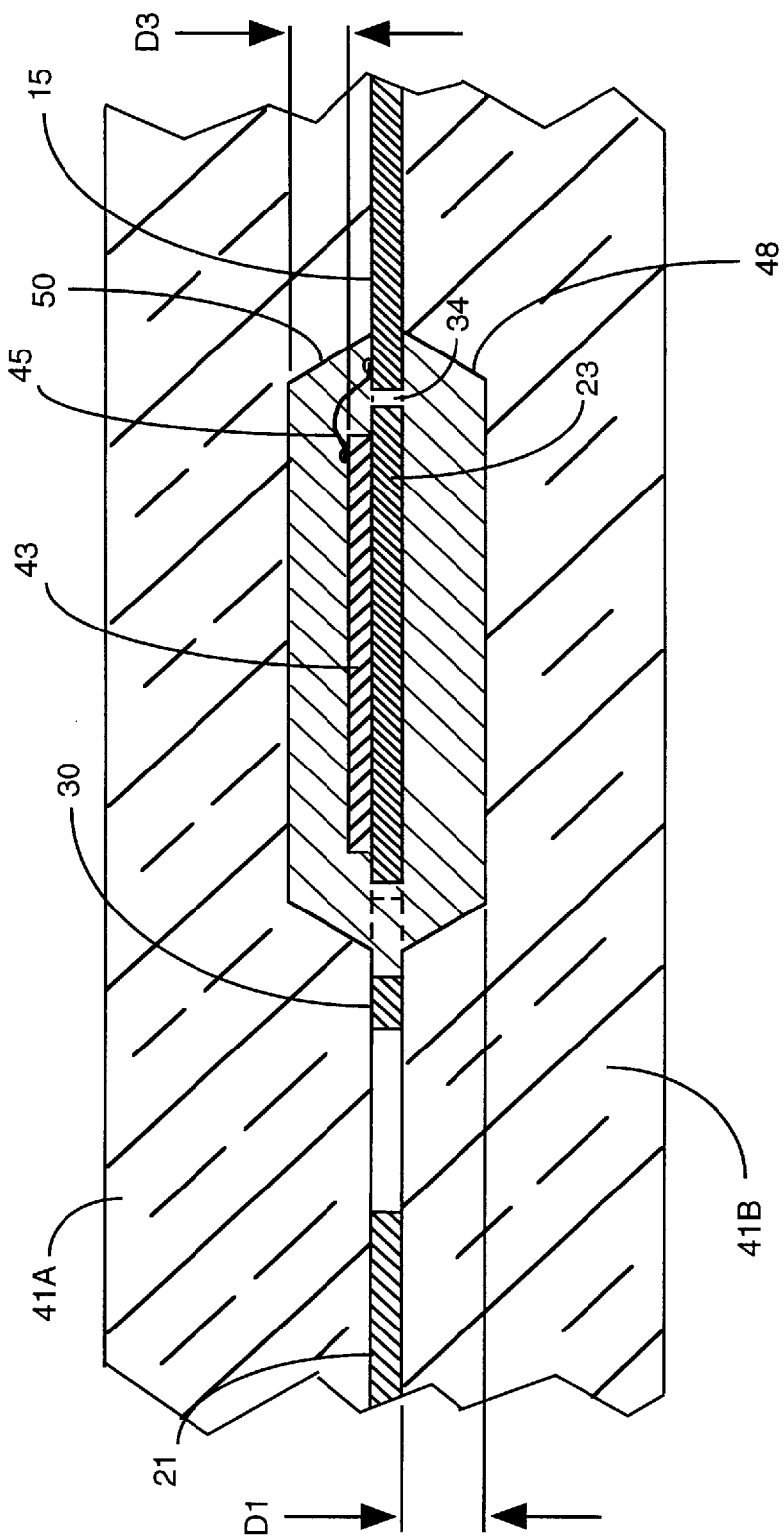
FIG. 3 is an elevation section view of a lead frame with die attached, and with a mold closed on the lead frame, as in the prior art, taken generally along the line 3—3 of FIG. 2.

FIG. 3 is a cross-sectional view of lead frame strip 21 taken along section line 3—3 of FIG. 2 after die placement and wire bonding, and with the lead frame strip placed between upper and lower portions 41A and 41B respectively of a mold. IC die 43 is shown attached to die attach pad 23 and wires 45 are bonded between each contact pad in the die and its corresponding lead. Wires 45 span gap 34 between each mounting pad on the IC die and its respective lead. It should be noted that the thickness of the lead frame and the depth of the cavity are exaggerated for purposes of bold illustration. The angle of the sidewalls is also exaggerated, and is typically about ten degrees, to facilitate release of a finished encapsulation from the mold cavity.

Within the body of each of the upper and lower portions of the mold, at each cavity, there are typically one or more passages into a cavity for entry of injected liquid-phase polymer and one or more passages for bleeding air displaced as polymer material enters. These passages are not shown in FIG. 3, but are typically located at the corners of the cavities. Further, the passages may be in either or both of the portions of the mold, and may vary in number for molds intended for different lead frames and packages. The location of the passages is an important characteristic in the flow characteristic in mold filling, which is believed to strongly influence the way die attach pads and heat spreaders may be displaced in the molding process.

Molds 41A and 41B are positioned and centered on each die 43, and liquid-phase polymer is injected and flows until it (hopefully) fills all of the volume around the die and the die attach pad. When the polymer has solidified, mold portions 41A and 41B are removed and lead frame strip 21, with encapsulated and bonded dies, including die 43, is ready for trimming to produce individual IC packages.

In FIG. 3, dimensions D1 and D3 represent clearances between the die attach pad or the IC die, and adjacent, nearby mold surfaces, which are, in this example, the indented surfaces of the cavities of each of the upper and lower mold portions.

In FIG. 3 no heat spreader is shown in the lower mold cavity. Dimension D1, however, is in the range of 0.030 to 0.060 inches to provide ample room for a heat spreader to be used. Again, FIG. 3 is not to scale, and some dimensions are greatly exaggerated.

FIG. 4 shows also another typical aspect of the upper and lower mold cavities, which has particular relevance in the present invention. This is the fact that walls 47, 48, 49, and 50 of the mold cavities are angled, typically about ten degrees from vertical, to facilitate release of molded and solidified material from the cavities. Although not shown specifically in the figures, in this particular example for a QFP package, the cavities are typically square in plan view, so a section at right angles to the section shown will be quite similar to the section shown. All four walls of each cavity are angled.

FIG. 4 is an elevation cross section similar to that of FIG. 3, showing a mold closed on a lead frame strip 46 with a heat spreader 51 in place in a lower mold cavity, as is known to the present inventor. In FIG. 4 the dimensions are shown more realistically, although not to scale. Also, lead frame strip 46 has a depressed island, or die attach pad 52, as is known in the art. In this example heat spreader 51 has a raised land 53 for contacting intimately the flat undersurface of die attach pad 23, and legs 55 formed by dimpling the material of the spreader, for supporting the spreader upon indented surface (bottom surface) 57 of the lower cavity. From raised land 53 other portions (59, 61) of the heat spreader that might underlie, or move to underlie leads of the lead frame are formed or machined at a lower level than land 53. This difference is typically from 0.005 to 0.015 inches. Assuming that the heat spreader remains in position, parallel to the lead frame strip and in areal contact with die attach pad, the extended portions 59 and 61 of the heat spreader will not contact leads of the lead frame strip, which would provide a direct electrical short, and render the package useless.

Given the angled walls of the lower cavity and the realities of fabrication tolerances, dimension D2 defining the overall width (or length) of heat spreader 51 must be made somewhat less than dimension D4, across walls 47 and 48 at the height of extensions 59 and 61. If this were not done, overlapping tolerances might well cause D2 to be greater than D4, and heat spreader 51 would be suspended between the walls when placed in the lower mold cavity, such that legs 55 would not reach surface 57. In this case when the mold is closed the raised land 53 of spreader 51 would be at too great a height in the lower cavity, and would displace the lead frame strip (or at least the die attach pad), and the resulting package would almost certainly be a reject.

In the opposite instance, wherein D4 is greater than D2, the heat spreader is free to move in the horizontal plane until it encounters one of the angled walls of the cavity. When polymer material is injected in this case, sudden lateral movement often causes heat spreader 51 to move laterally relatively quickly, contacting either wall 47 or 48, or walls of the cavity 49 and 50 not shown in FIG. 4. Since these walls are angled, this contact with an angled wall often results in the heat spreader being displaced upward into the lead frame strip, contacting the leads (shorts), or even displacing and distorting portions of the lead frame strip.

Because of realistic tolerances for fabrication that have to placed on both the heat spreader and the mold cavity dimensions the inventors have found it to be impractical to try to control these dimensions to ensure that every heat spreader placed in a cavity contacts the walls of the cavity horizontally, or fits so closely that lateral motion will not be a problem.

Figure 5A:
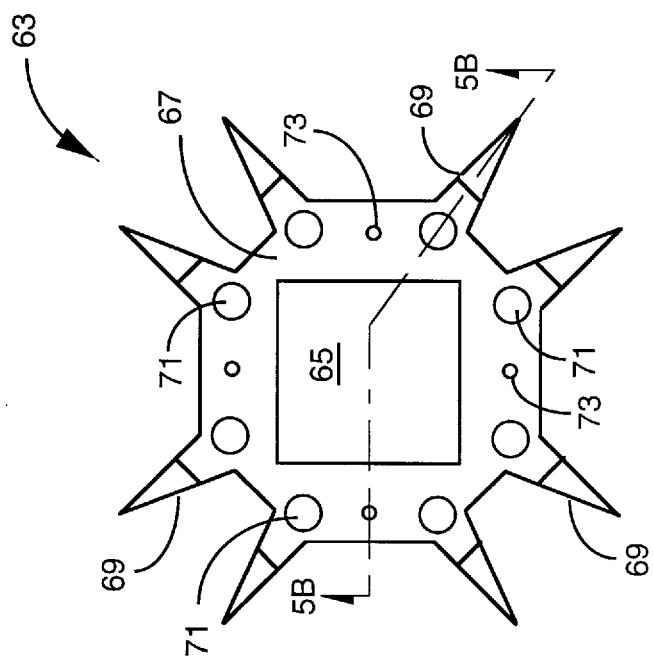
FIG. 5A is a plan view of a heat spreader according to a preferred embodiment of the present invention
Figure 5B:
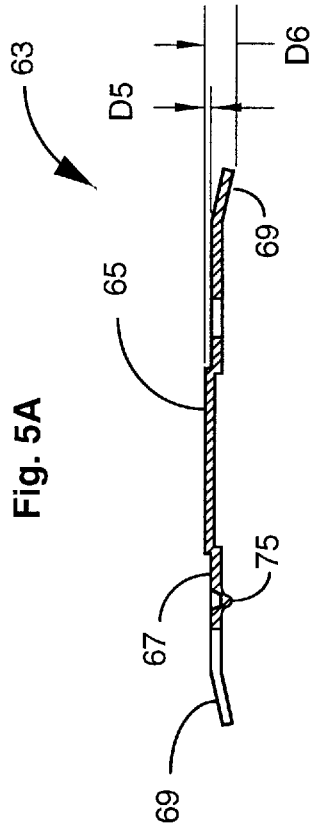
FIG. 5B is an elevation section view of the heat spreader of FIG. 5A taken along section line 5B—5B of FIG. 5A.

FIG. 5A is a plan view of a heat spreader 63 according to a preferred embodiment of the present invention, and Fig. 5B is an elevation cross-section view of heat spreader 63 of FIG. 5B, taken along section line 5B—5B of FIG. 5A. Heat spreader 63 comprises a raised land 65 surrounded by a body portion 67, and 8 appendages 69 arranged to provide an octagon shape in the plan view. It will be apparent to those with skill in the art in the following descriptions that the octagon shape is not limiting in the scope of the invention, as many other arrangements and patterns of appendages are possible. An important feature is that there be such appendages from the body of the heat spreader toward each of the walls of a cavity in which the heat spreader might be disposed.

In the embodiment of FIG. 5A and FIG. 5B, there is a pattern of eight holes 71 through body portion 67. These holes and other patterns of holes in other embodiments serve a variety of purposes. In some embodiments the holes serve to adjust the mass of the heat spreader; in other embodiments the holes are strategically positioned to facilitate filling of a closed mold with liquid polymer in the injection phase of the encapsulation process.

There are also in body 67 four dimples 73 arranged in a square pattern for providing a support base of four supports 75 for the heat spreader. Raised land 65 is in this embodiment coplanar with and nominally 0.012 inches above the upper surface of body portion 67 (D5). The total height of the heat spreader (D6) is nominally 0.054. In this embodiment this overall height will be the vertical dimension from the bottom of a lower cavity in an encapsulation mold in which the spreader is intended to be placed, to the undersurface of a die attach pad of a lead frame captured between the upper and lower portions of the encapsulation mold. This accommodation will be better understood with further description below.

In the embodiment of the invention shown in FIGS. 5A and 5B the tips of each of the eight appendages 69 are displaced downward such as by bending, so the lower extension of the tip end of each of the appendages is on the same level as the lower extremity of each of four supports 75. On a flat surface heat spreader 63 will be supported from the surface on twelve or twelve points; eight or eight being the supports 75 formed by dimples 73 and the other four being the tip ends of appendages 69.

Figure 6B:
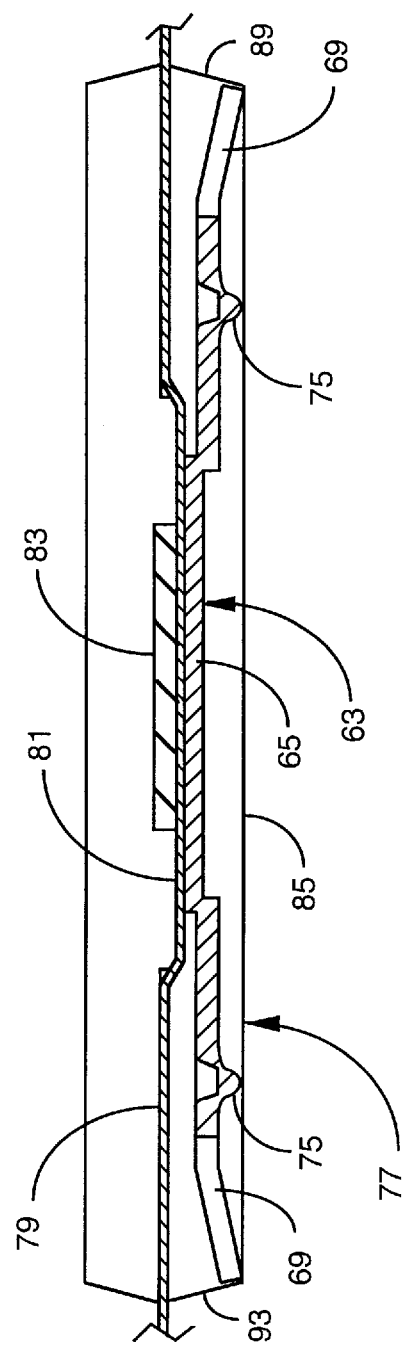
FIG. 6B is a section view of the spreader and lower cavity of FIG. 6A taken along section line 6B—6B of FIG. 6A.

FIG. 6A is a plan view of heat spreader 63 of FIGS. 5A and 5B placed in a lower cavity 77 of an encapsulation mold, and FIG. 6B is a cross section of cavity 77 with heat spreader 63 in place, taken along section line 6B—6B of FIG. 6A, showing also an upper cavity for the encapsulation mold and a lead frame strip 79 captured between the closed sections of the encapsulation mold. Lead frame strip 79 has a die attach pad 81 with a die 83 attached. Die 83 is wire bonded to leads of the lead frame strip, but these details are not shown.

Heat spreader 63 has an overall height such that with supports 75 supporting the heat spreader on bottom surface 85 of the lower cavity, raised land 65 is in surface-to-surface contact with the undersurface of die attach pad 81. Through this intimate surface-to-surface contact heat generated by die 83 is easily transferred into heat spreader 63. Appendages 69 are formed downward at the outermost extremity of each such that the ends of the appendages also contact bottom surface 85, or nearly so.

Referring now to plan view FIG. 6A, appendages 69 are sized and formed such that the overall footprint of the heat spreader is within the boundary of bottom surface 85. The boundary is formed by the intersection of angled sidewalls 87, 89, 91, and 93 with bottom surface 85. Preferably the overall extent of the heat spreader is only nominally smaller than the boundary extent, limiting lateral movement of the spreader when polymer material is injected. This difference in size is not critical however, except the overall extent of the heat spreader cannot be greater in any direction than the boundary extent, because if the extent of the spreader is greater, the spreader will not engage properly in the lower cavity, and the lead frame will be distorted when the mold closes.

Referring now to FIG. 6B, because the extent of the spreader is less than the extent of the boundary, the spreader can in many cases, depending on the initial position of the spreader relative to sidewalls 87, 89, 91, and 93, move a small distance laterally when polymer is injected. Given this movement, the bent tips on one, or possibly two sides will contact angled sidewalls. The inventors have found in practice that this contact, between a sidewall and a bent-down tip, does not displace the heat spreader upward as described for the spreaders of the prior art. It is believed that part of the reason for this more stable performance lies in the nature of the angle between the moving outer end of an appendage 69 and a sidewall at or near the base of the sidewall, where it intersects the bottom surface of the lower cavity. Part of the more-stable performance is provided by the maximum base size formed by the four supports 75 and the outer tips of appendages 69.

It will be apparent to those with skill in the art that there are a number of alterations that might be made in details of the invention without departing from the spirit and scope of the invention. For example, a spreader need not have appendages such as appendages 69 on all four sides, and the spreader need not have two such appendages to each side, as is shown in FIG. 5A. There might be such appendages to two sides only, and there could be one or more than two appendages in the same direction. The shape shown in examples above is exemplary. Two appendages to each side help to prevent rotation of a spreader during injection.

Spreaders in embodiments of the present invention may be made of several suitable materials, with the understanding that the purpose is to absorb heat. Heat transfer capability and thermal mass are important features. There may also be many other dimensional differences in various embodiments without departing from the spirit and scope of the invention. Spreaders in embodiments of the invention may be made for mold cavities of many shapes and sizes, and for lead frames of many types and sizes as well. Many other alterations are possible within the spirit and scope of the present invention. The scope of the invention is limited only by the following claims.

What is claimed is:

1. A heat spreader for encapsulation in an IC package, comprising:

a body portion;

a raised land on the body portion, the raised land having a substantially flat surface defining a first and uppermost plane, the substantially flat surface adapted for contacting an undersurface of a die attach pad of a lead frame; and appendages from the body portion, extending from the body portion in a second and intermediate plane substantially parallel with the first plane;

wherein individual ones of the appendages are formed downward at the ends furthest from the body portion such that the ends of the downwardly-formed appendages define a third and lowermost plane substantially parallel with the first plane, in a manner that no appendages not downwardly-formed extend from the body portion to a greater distance than the downwardly-formed appendages.

2. The heat spreader of claim 1 further comprising three or more supports extending away from the body portion on the opposite side of the body portion from the raised land, the ends of the supports lying in the third and lowermost plane.

3. The heat spreader of claim 2 wherein there are four supports.

4. The heat spreader of claim 1 wherein there are four appendages.

5. The heat spreader of claim 1 wherein there are eight appendages, two appendages side-by-side extending in each of the four directions, wherein four lines drawn across the tips of each pair of side-by-side appendages form by their intersections a rectangle in the third plane.

6. The heat spreader of claim 1 wherein the material of the heat spreader is a material that conducts heat better than the mold compound material.

7. A method for preventing upward motion of a heat spreader during injection molding, the method comprising steps of:

(a) providing appendages from a body of the heat spreader extending toward each of the side walls;

(b) forming a portion of each of the appendages furthest from the body at a downward angle such that the ends of the appendages define a plane, there then being no appendages extending from the body to a distance greater than the extended distance of the downwardly-formed appendages; and (c) placing the heat spreader in a mold such that the heat spreader is supported by the downwardly-formed ends of the appendages.

8. The method of claim 7 wherein in step one eight appendages are provided as four side-by-side pairs, each side-by-side pair extending toward one of the four sidewalls.

* * * * *